CODE TRANSLATION FILTER

Filed Oct. 18, 1966 2 Sheets-Sheet 1

INVENTOR.
ADOLF W. LOHMANN

BY [signature]
ATTORNEY

Feb. 24, 1970 A. W. LOHMANN 3,497,288

CODE TRANSLATION FILTER

Filed Oct. 18, 1966 2 Sheets-Sheet 2

United States Patent Office 3,497,288
Patented Feb. 24, 1970

3,497,288

CODE TRANSLATION FILTER

Adolf W. Lohmann, Los Gatos, Calif., assignor to International Business Machines Corporation, Armonk, N.Y., a corporation of New York Filed Oct. 18, 1966, Ser. No. 587,507
Int. Cl. G02b *5/18, 27/38*
U.S. Cl. 350—162 4 Claims

ABSTRACT OF THE DISCLOSURE

A binary filter is described for use in an optical system where it is desired to translate optically a given object into a desired image. This operation is performed by illuminating an object of a collimated beam from a source. The collimated light from the object is passed through a binary mask and a first diffraction order from the mask is imaged by a lens. The binary mask operates to modify the object waves in phase and amplitude in a manner to provide a resulting wave which, when imaged, produces the desired image. The binary filter has application in holographic character recognition.

This invention relates generally to optical filters and particularly to that type of filter which converts a wave emanating from a given object into a wave representing a given image. Another name for such filters is code translater or code converter.

A code translator filter was described by Gabor in Nature, vol. 208, page 422, 1965. This spatial filter was designed to produce a predetermined image from a given object. For example, a set of objects might be the numerals 0, 1, . . . 9 and the images corresponding to these objects could be binary representations such as ordered spots of light. This type of binary output lends itself particularly well to detection by simple means such as photocells and the resulting output is in a form which is readily accepted by a digital computer. The application of this filter to the preparation of written information for feeding into a computer is of particular significance.

The filter of Gabor is produced by holographic techniques which include the recording of an interference pattern produced from an object wave and a reference wave. In the case of the code translation filter, the reference wave is produced by physical means and, therefore, the object which produces the reference wave must also exist in the physical sense. This limitation prevents complete optimization of the filter and limits the type of output signal which can be obtained.

It is, therefore, an object of my invention to provide an improved code translation filter.

It is another object of my invention to provide an improved method for the fabrication of a code translation filter.

Still another object of my invention is to provide an improved system for optical code conversion.

A still further object of my invention is to provide a code translation filter which does not require the physical existence of an object to provide a reference wave.

Another object of my invention is to provide a method for the fabrication of a code translation filter which may be used to convert any object into any image.

These objects are accomplished by a system which collimates the light from the object and illuminates a filter. The wave which illuminates the filter can be described in terms of phase and amplitude. The filter is divided into a number of cells. The wave falling on the individual cells is then described in terms of phase and amplitude. The same analysis is performed to determine the amplitude and phase of a wave which would result in the desired object. The filter operates to modify the phase and amplitude of the object wave in a manner such that the output of the filter is a wave which represents, in phase and amplitude, the wave which generates the desired image. In very simple terms, the output phase and amplitude for a given cell are divided by the desired input phase and amplitude for the same cell. From this quotient, the filter characteristics are derived. In other words, the filter represents the manner in which the input wave must be modified in phase and amplitude in order to obtain the necessary phase and amplitude characteristics in the wave which is used to generate the object.

The foregoing and other objects, features and advantages of the invention will be apparent from the following more particular description of a preferred embodiment of the invention.

Figure 1:
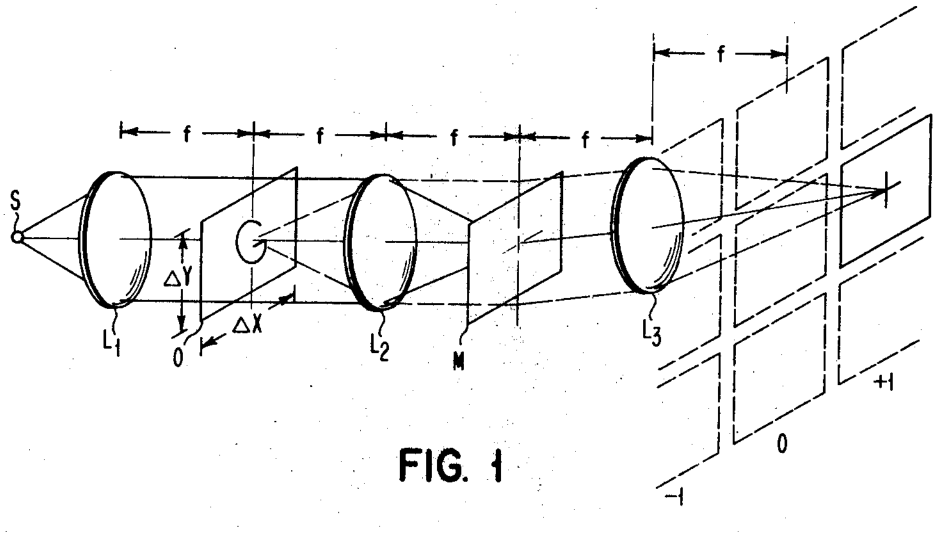
FIGURE 1 is an optical system for code translation according to the invention.

In the system of FIGURE 1, light source S is used to provide spectrally and spatially coherent light. A portion of the light from source S is collimated by lens $L_1$ which is located a distance $f$ from the source S. The collimated beam is used to illuminate the object O which is shown to be the letter G superimposed on a transparent background. For the purpose of convenience, the object is shown to be located at a distance $f$ from the lens $L_1$. The dimensions of the object field are shown as $\Delta x$ and $\Delta y$. A second lens, $L_2$, is positioned at a distance $f$ from the object O and also the filter mask M. This allows lens $L_2$ to perform two functions, the creation of an image of the source S in the plane of mask M, and the collimation of the light from the object O. The filter mask M will be discussed in detail later. It is sufficient to state that it operates to modify the phase and amplitude of the collimated wave from the object O in the light which forms the first diffraction order. The lens $L_3$, located at a distance $f$ from the mask M, brings the light which forms the first diffraction order from mask M to a focus in the image plane. It will be seen that a number of diffraction orders are created by the mask M in the image plane. Since the effect of the mask on the phase and amplitude of the transmitted wave will differ for each order, it is necessary to select a particular order where the images will be viewed and design the mask around that order. In the preferred embodiment the +1st order is used.

Figures 2, 3:
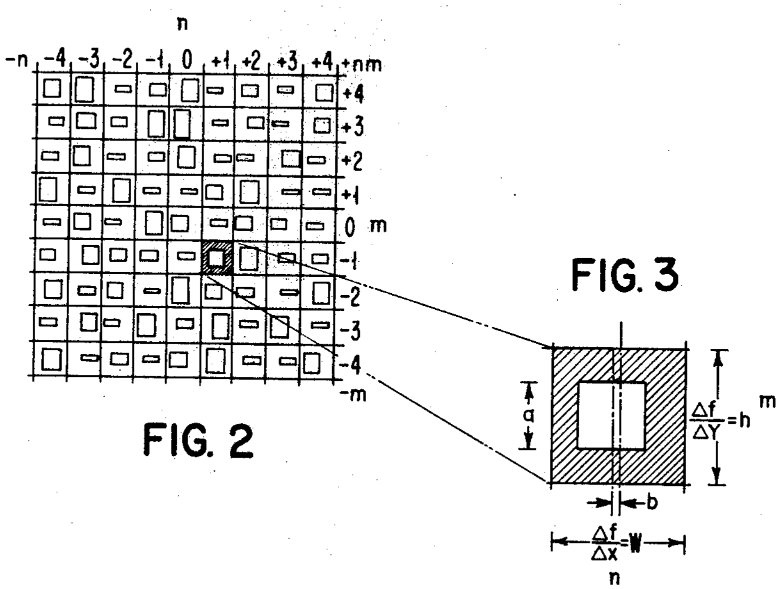
FIGURE 2 is a fragmentary section of the type of mask used to perform the invention.
FIGURE 3 is a detailed view of an individual cell in the mask of FIGURE 2.

In order to simplify the design of the mask, it is divided into a large number of small cells as shown in FIGURE 2. The cells are identified according to the indices $n$ and $m$. Only a small portion of the mask is shown in FIGURE 2. The cells along the edges of the mask at the extremity of the $n$ index are identified by $n_{max}$. Likewise, the cells along the edges of the mask at the extremity of the $m$ index are identified by $m_{max}$. A typical cell is shown in somewhat greater detail in FIGURE 3. The background of the cell is opaque. The transparent slit portion of the cell is selected to be one-half as wide as the width of the cell. The height of the transparent slit portion is termed "$a$" and will depend upon the desired amplitude function at the particular cell. The location of the center of the transparent slit portion of the cell is the distance "$b$" from the center of the cell. This distance determines the phase characteristic of the cell.

A detailed description of the theory of operation of binary filters of this type is contained in my co-pending application, "Complex Spatial Filter Consisting of Binary Elements" Ser. No. 456,127 filed May 17, 1965; now abandoned.

The first step in the design and construction of the filter for code translation is to determine the phase and amplitude of the light coming from the selected object and falling on each cell. One obvious means of performing this analysis would be to insert the desired object into the object plane and physically measure the resulting amplitude in each of the individual cells. The phase could be determined in each of the individual cells by comparison with a reference wave. This technique for determination of the phase and amplitude characteristics of the collimated wave from the object is quite cumbersome and probably would not be followed in most cases. A better method involves a computer which evaluates the Fourier transform of the object to define the collimated wave in terms of phase and amplitude characteristics. This is a fairly conventional operation on a computer and may be accomplished by the Cooley-Tukey program available in SHARE as program number HARM SDA #3425. This step may be defined mathematically as the Fourier transform of the object, $u(x, y)i$ (1) $$u(x, y)\rightarrow\tilde{u}(\gamma_x, \gamma_y);$$

where $\gamma_x$ and $\gamma_y$ are the spatial frequencies in the $x$ and $y$ dimension, and $u$ is the frequency spectrum of the object which appears in the Fourier plane.

The next step is a corresponding evaluation of the desired image. It is necessary to determine the phase and amplitude of the wave which can be brought to a focus to provide the desired image. While the physical process is the reverse of that relating to the object since the determination of a wave which will produce an image instead of the wave which results from an object, the same mathematical relationship exists. The second step is the Fourier transform of the desired image, $v(x, y)$;

(2) $$v(x,y)\rightarrow\tilde{v}(\gamma_x, \gamma_y);$$

where $\tilde{v}$ is the frequency spectrum of the image.

The preceding two steps were carried out at discrete points in the plane of the mask at intervals corresponding to the cell width and the cell height. The points were selected to coincide with the centers of the cells. The evaluation of the Fourier transform of the object and the image gives a phase and amplitude characteristic for the image wave and the object wave in each cell. To convert the object wave into the image wave (3) $$\tilde{u}F=\tilde{v}$$

it is necessary for the filter to perform the mathematical operation of division. This may be expressed:

(4) $$\frac{\tilde{v}}{\tilde{u}}=F(\gamma_x, \gamma_y);$$

where $F(\gamma_x, \gamma_y)$ is the filter function. In the event that the evaluation of the Fourier transforms for the image and the object was carried out at the discrete points corresponding to the cell centers, each cell will have associated therewith a first value (5) $$A_{u^{nm}}e^{i\phi_{u^{nm}}}$$

where (6) $A_{unm}$ represents the amplitude of the object wave; and (7) $\phi_{unm}$ represents the phase of the object wave.

Each cell will have corresponding values for the image wave according to:

(8) $$A_{v^{nm}}e^{i\phi_{v^{nm}}}$$

where (9) $A_{vnm}$ represents the amplitude of the image wave; and where

(10) $\phi_{vnm}$ represents the phase of the image wave.

The filter characteristic in terms of amplitude at the cell $nm$ will be:

(11) $$A_{nm}=\frac{A_{v^{nm}}}{A_{u^{nm}}}$$

Similarly, the filter characteristic in terms of phase at the cell $nm$ will be:

(12) $$\phi_{nm}=\phi_{vnm}-\phi_{unm}$$

Now we have to relate the amplitude $A_{nm}$ of the filter function with the height $a_{nm}$ of the $(nm)$, and the corresponding relation between filter phase $\phi_{nm}$ and position $b_{nm}$ of the slit in the $(nm)$ cell. As has been shown in the copending application, these relations are:

(13) $$A_{nm}=A_{max.}\frac{A_{nm}}{h}$$

(14) $$\phi_{nm}=2\pi\frac{b_{nm}}{w}$$

or, in inverse presentation:

(15) $$a_{nm}=h\frac{A_{nm}}{A_{max.}}$$

(16) $$b_{nm}=w\frac{\phi_{nm}=}{2\pi}$$

Other configurations for the cells may be utilized. For example, a slit of constant height but of varying width could be used. Or, instead of a slit, various sized dots or other arbitrary shape could be used. All that is required is that each cell appropriately modify the phase and amplitude as defined in (13) and (14) above.

Figure 4:
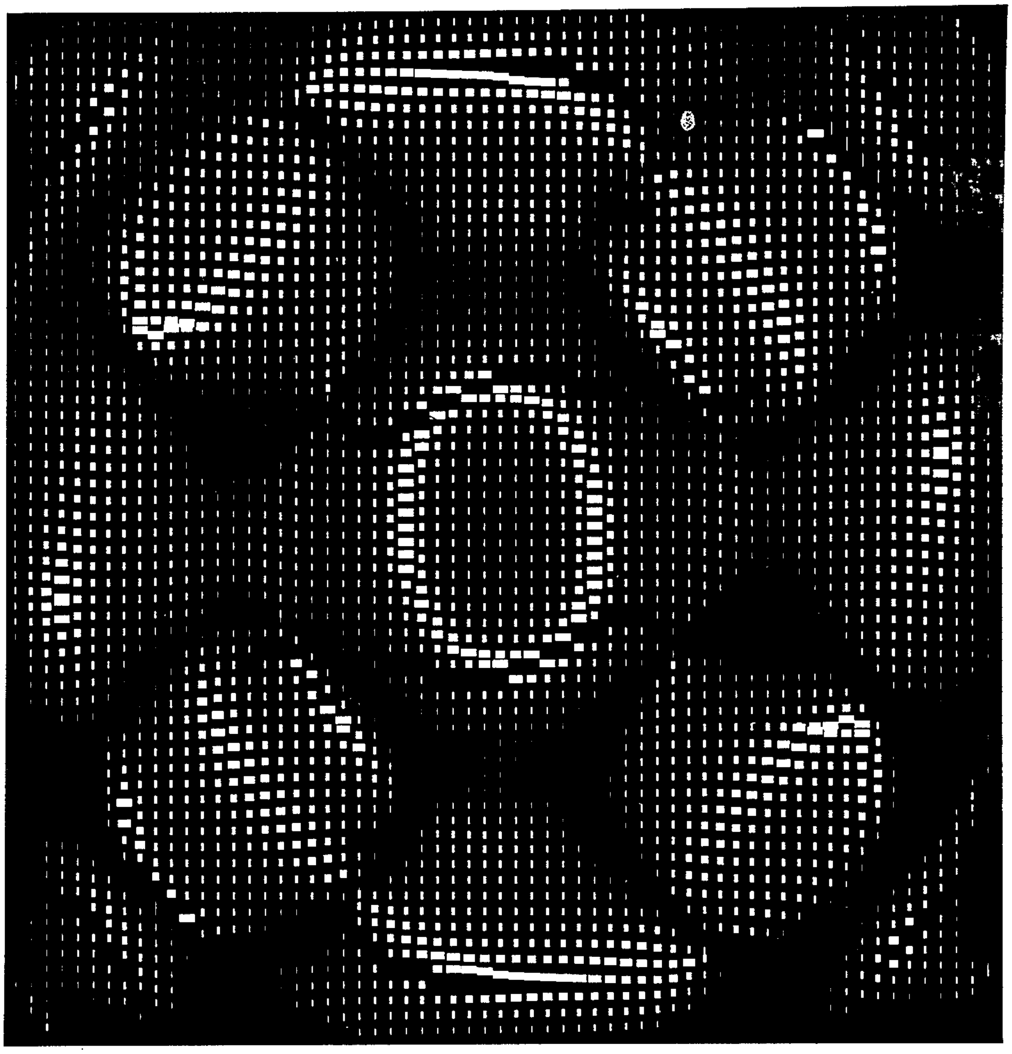
FIGURE 4 is a binary mask designed for the purpose of translating the letter G into a plus sign, +.

FIGURE 4 shows a mask for the conversion of a letter G into a plus sign, +. It can be seen from general examination of this filter that the bright fringes are generally circular. These represent zeros in the denominator $\tilde{u}$ (the letter G). The dark fringes, which appear generally as $v$'s along the $x$ and $y$ axes with the small end directed to the center, represent zeros in the numerator $\tilde{v}(+)$.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A spatial filter for translating an object $u$ $(x, y)$ into an image $v$ $(x, y)$ according to the function $F=\tilde{v}/\tilde{u}$ where $$\tilde{u}=A_ue^{i\phi u}$$

and $$\tilde{v}=A_ve^{i\phi v}$$

representing the Fourier transforms of the object $u$ and image $v$ respectively, said filter comprising:

a binary mask, said mask having a plurality of cells having a width "$w$" and a height "$h$" and being identified by a set of indices $n$ and $m$; each of said cells containing a strip of equal width and of height "$a$" located at a distance "$b$" from the center of said cell measured along a direction perpendicular to the height of the cell, said strip having a transparency which differs from that of the remainder of said cell: the strip of at least one of the plurality of cells having a height different from the height of the strips in the remaining cells;

the value "$a$" for the cell of index $nm$ being defined:

$$a_{nm}=\left(\frac{A_{nm}}{A_{max.}}\right)h$$

where $A_{max}$ is the maximum of the modulus of the filter function $$A_{nm}=\frac{A_{v^{nm}}}{A_{u^{nm}}}$$

and $A_{unm}$ is the amplitude of the Fourier integral for the object $u$ in the cell $nm$;

$A_{vnm}$ is the amplitude of the Fourier integral for the image $v$ in the cell $nm$;

the value "$b$" for the cell of index $nm$ being defined:

$$b_{nm}=\frac{w}{2\pi}\phi_{nm}$$

where $$\phi_{nm}=\phi_{\tilde{v}^{nm}}-\phi_{\tilde{u}^{nm}}$$

and $$\phi_{\tilde{u}^{nm}}$$

is the phase of the Fourier integral for the object $u$ in the cell $nm$;

$$\phi_{\tilde{v}^{nm}}$$

is the phase of the Fourier integral for the image $v$ in the cell $nm$.

2. A filter according to claim 1 wherein the width of said strip is $w/2$.

3. A system for operating on a wave which follows the stationary wave equation to convert an object $u$ into an image $v$, comprising:

a source of radiation;

means for modifying a portion of the radiation from said source according to object $u$;

a binary mask, positioned in the Fourier transform of said source, which influences the modified radiation, said mask having a plurality of cells having a width "$w$" and a height "$h$" and being identified by a set of indices $n$ and $m$; each of said cells containing a strip of equal width and of height "$a$" located at a distance "$b$" from the center of said cell measured along a direction perpendicular to the height of the cell, said strip having a transparency which differs from that of the remainder of said cell; the strip of at least one of the plurality of cells having a height different from the height of the strips in the remaining cells; the value "$a$" for the cell of index $nm$ being defined:

$$a_{nm}=\left(\frac{A_{nm}}{A_{max.}}\right)h$$

where $A_{max}$ is the maximum of the modulus of the filter function $$A_{nm}=\frac{A_{v^{nm}}}{A_{u^{nm}}}$$

and $A_{unm}$ is the amplitude of the Fourier integral for the object $u$ in the cell $nm$;

$A_{vnm}$ is the amplitude of the Fourier integral for the image $v$ in the cell $nm$;

the value "$b$" for the cell of index $nm$ being defined:

$$b_{nm}=\frac{w}{2\pi}\phi_{nm}$$

where $$\phi_{nm}=\phi_{\tilde{v}^{nm}}-\phi_{\tilde{u}^{nm}}$$

and $$\phi_{\tilde{u}^{nm}}$$

is the phase of the Fourier integral for the object $u$ in the cell $nm$;

$$\phi_{\tilde{v}^{nm}}$$

is the phase of the Fourier integral for the image $v$ in the cell $nm$; and means for developing an image of said object from the modified radiation influenced by said mask.

4. The method of converting an object $u$ into an image $v$, comprising the steps of:

(1) illuminating the object $u$ with radiation from a source which follows the stationary wave equation;

(2) forming an image of said source from said modified radiation;

(3) positioning a binary mask in the plane of said image of said source to influence said modified radiation, said mask having a plurality of cells having a width "$w$" and a height "$h$" and being identified by a set of indices $n$ and $m$; each of said cells containing a strip of equal width and of height "$a$" located at a distance "$b$" from the center of said cell measured along a direction perpendicular to the height of the cell, said strip having a transparency which differs from that of the remainder of said cell; the strip of at least one of the plurality of cells having a height different from the height of the strips in the remaining cells; the value "$a$" for the cell of index $nm$ being defined:

$$a_{nm}=\left(\frac{A_{nm}}{A_{max}}\right)h$$

where $A_{max}$ is the maximum of the modulus of the filter function $$A_{nm}=\frac{A_{v^{nm}}}{A_{u^{nm}}}$$

and $A_{Unm}$ is the amplitude of the Fourier integral the object $u$ in the cell $nm$;

$A_{vnm}$ is the amplitude of the Fourier integral the image $v$ in the cell $nm$;

the value "$b$" for the cell of index $nm$ being defined:

$$b_{nm}=\frac{w}{2\pi}\phi_{nm}$$

where $$\phi_{nm}=\phi_{\tilde{v}^{nm}}-\phi_{\tilde{u}^{nm}}$$

and $$\phi_{\tilde{u}^{nm}}$$

is the phase of the Fourier integral for the object $u$ in the cell $nm$;

$$\phi_{\tilde{v}^{nm}}$$

is the phase of the Fournier integral for the image $v$ in the cell $nm$;

(4) forming an image of said object from the modified radiation influenced by said source.

References Cited

Kozma et al., Applied Optics, vol. 4, No. 4, April 1965, pp. 387–392.

Brown et al., Applied Optics, vol. 5, No. 6, June 1966, pp. 967–969.

DAVID SCHONBERG, Primary Examiner

RONALD J. STERN, Assistant Examiner